United States Patent
Nakamura

[11] Patent Number: 5,982,042
[45] Date of Patent: *Nov. 9, 1999

[54] SEMICONDUCTOR WAFER INCLUDING SEMICONDUCTOR DEVICE

[75] Inventor: Kazuko Nakamura, Tokyo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/712,611

[22] Filed: Sep. 13, 1996

[30] Foreign Application Priority Data

Mar. 18, 1996 [JP] Japan .................................... 8-060794

[51] Int. Cl.$^6$ .......................... H01L 23/58; H01L 27/10; H01L 23/48; H01L 23/52
[52] U.S. Cl. ......................... 257/786; 257/773; 257/48; 257/203
[58] Field of Search ................................. 257/786, 773, 257/784, 48, 203

[56] References Cited

U.S. PATENT DOCUMENTS

| | | | |
|---|---|---|---|
| 5,059,899 | 10/1991 | Farnworth et al. | 394/158 R |
| 5,239,191 | 8/1993 | Sakumoto et al. | 257/203 |
| 5,532,518 | 7/1996 | Hakey et al. | 257/773 |

FOREIGN PATENT DOCUMENTS

| | | | |
|---|---|---|---|
| 59-52860 | 3/1984 | Japan . | |
| 62-106638 | 3/1987 | Japan | 257/786 |
| 2-184043 | 7/1990 | Japan | 257/48 |
| 2211648 | 8/1990 | Japan . | |
| 2235356 | 9/1990 | Japan . | |
| 3-22456 | 1/1991 | Japan | 257/786 |
| 5206383 | 8/1993 | Japan . | |
| 5299484 | 11/1993 | Japan . | |
| 6-37137 | 2/1994 | Japan | 257/786 |
| 685019 | 3/1994 | Japan . | |
| 6151535 | 5/1994 | Japan . | |
| 7235598 | 9/1995 | Japan . | |

*Primary Examiner*—Mahshid Saadat
*Assistant Examiner*—Jhihan B Clark
*Attorney, Agent, or Firm*—Leydig, Voit & Mayer, Ltd.

[57] ABSTRACT

A semiconductor wafer, a semiconductor device, and a method of manufacturing the semiconductor device which prevent corrosion of pads in a semiconductor integrated circuit. A semiconductor wafer having semiconductor integrated circuits and interconnections extending from wire-bonding pads on the semiconductor integrated circuits to a dicing line is cut along the dicing line into chips. Part of the interconnections are left on the chips as wafer testing pad remainders, and the surfaces of the wafer testing pad remainders are covered with an insulating film, preventing the invasion of water from the wafer testing pad remainders and corrosion of the wire-bonding pads in the semiconductor integrated circuit, improving reliability and durability of the semiconductor device.

8 Claims, 19 Drawing Sheets

SEMICONDUCTOR WAFER INCLUDING SEMICONDUCTOR DEVICE

BACKGROUND OF THE INVENTION

1. Field of the Invention

The present invention relates to a semiconductor wafer, a semiconductor device and a method of manufacturing the semiconductor device, and particularly to a semiconductor wafer having an interconnection extending from a pad on a semiconductor device across to a dicing line, and a semiconductor device formed from that semiconductor wafer and a method of manufacturing the semiconductor device.

2. Description of the Background Art

FIG. 16 is a top view showing a conventional semiconductor wafer. A wafer test is conducted with wafer testing probes 4 applied to wire-bonding pads 2 in the semiconductor integrated circuits 1a. FIG. 17 is a sectional view of the semiconductor wafer 1 shown in FIG. 16. After the wafer test is finished, referring to FIG. 18, the wafer is cut along the dicing line 6 so that the semiconductor integrated circuits 1a are separated into chips. FIG. 19 and FIG. 20 respectively correspond to FIG. 17 and FIG. 18, which show application of an insulating film 9 for protecting active regions on the semiconductor integrated circuits 1a. After separating the semiconductor integrated circuits 1a as chips, wires (not shown) connected to the wire-bonding pads 2 of the semiconductor integrated circuits 1a are bonded.

When the wafer testing probes 4 come into contact with the wire-bonding pads 2, they cause damage 5 to the wire-bonding pads 2. Recently, the wire-bonding pads 2 have been increasingly miniaturized to reduce the size of the semiconductor integrated circuits 1a and to increase the ratio of the active regions in the semiconductor integrated circuits 1a. Accordingly, due to the miniaturization of the semiconductor integrated circuits 1a, the bonding wires are likely to be connected to the damaged parts of the wire-bonding pads 2, which will cause poor connection between the wire bonding pads 2 and the bonding wires.

FIG. 21 shows a section of a conventional semiconductor wafer 1 for preventing the inferior connection. The wafer test is conducted with the wafer testing probes 4 applied only on the wafer testing pads 3 within the dicing line 6. After the wafer test is finished, referring to FIG. 22, it is cut along the dicing line 6 and the semiconductor integrated circuits 1a are thus separated as chips. FIG. 23 and FIG. 24 correspond to FIG. 21 and FIG. 22, respectively, which show the application of the insulating film 9 for protecting active regions on the semiconductor integrated circuits 1a.

As shown in FIG. 22, however, the top surfaces and the cut sections of the wafer testing pad remainders 3a are exposed. This causes the problem that substances which corrode aluminum (Al), such as water, potassium, magnesium, etc., invade the wire-bonding pads 2 from the wafer testing pad remainders 3a to cause aluminum corrosion of the wire-bonding pads 2.

SUMMARY OF THE INVENTION

According to a first aspect of the present invention, a semiconductor wafer comprises: a semiconductor integrated circuit formation region for formation of a semiconductor integrated circuit having a first pad; a cutting region formed around the semiconductor integrated circuit formation region for cutting the semiconductor integrated circuit as a chip; a second pad existing on the cutting region; and an interconnection electrically connecting the first pad and the second pad and having a bend on the semiconductor integrated circuit formation region.

Preferably, according to a second aspect of the present invention, the area of the second pad is larger than the area of the first pad.

Preferably, according to a third aspect of the present invention, the second pad is formed around the semiconductor integrated circuit formation region without a vacant area having the same area as an area in which at least one second pad can be formed existing in the cutting region around the semiconductor integrated circuit formation region.

Preferably, according to a fourth aspect of the present invention, the semiconductor integrated circuit formation region includes a plurality of semiconductor integrated circuits including first and second semiconductor integrated circuit formation regions, the interconnection includes a plurality of interconnections including first and second interconnections, the first interconnection electrically connects the first pad on the first semiconductor integrated circuit formation region and the second pad and has a bend on the first semiconductor integrated circuit formation region, and the second interconnection electrically connects the first pad on the second semiconductor integrated circuit formation region and the second pad and has a bend on the second semiconductor integrated circuit formation region.

A fifth aspect of the present invention relates to a semiconductor device formed by cutting along a cutting region a semiconductor wafer having an interconnection extending across from a semiconductor integrated circuit formation region for formation of a semiconductor integrated circuit to the cutting region formed around the semiconductor integrated circuit formation region, which comprises an insulating film covering a cut section of the interconnection.

A sixth aspect of the present invention relates to a semiconductor device formed by cutting a semiconductor wafer having an interconnection extending across from a semiconductor integrated circuit formation region for formation of a semiconductor integrated circuit to a cutting region formed around the semiconductor integrated circuit formation region, along the cutting region, wherein the interconnection on the semiconductor integrated circuit formation region has a bend.

According to a seventh aspect of the present invention, a method of manufacturing a semiconductor device which comprises the steps of: preparing a semiconductor wafer having an interconnection extending across from a semiconductor integrated circuit formation region for formation of a semiconductor integrated circuit to a cutting region formed around the semiconductor integrated circuit formation region; cutting the interconnection by forming a groove at the boundary between the semiconductor integrated circuit formation region and the cutting region; forming an insulating film covering the cut section of the interconnection in the groove; and cutting along the cutting region to separate the semiconductor integrated circuit as a chip.

Preferably, according to the eighth aspect of the present invention, in the step of forming the insulating film the insulating film is formed in the semiconductor integrated circuit formation region except on a wire-bonding pad of the semiconductor integrated circuit and in the cutting region.

According to the first aspect of the present invention, when the semiconductor integrated circuits are separated into chips, the bend prevents invasion of water etc. from the interconnection to prevent corrosion of the first pad, providing the effect of improving the reliability and the durability of the semiconductor device products.

According to the second aspect of the present invention, the large area of the second pad allows an increase of permissible positional deviation when bringing the probe into contact with the second pad in a wafer test, providing the effect of facilitating the process of the wafer test.

The third aspect of the present invention has the effect that the cutting region around the semiconductor integrated circuit formation region can be efficiently utilized.

The fourth aspect of the present invention produces the effect of miniaturizing the cutting region, leading to an increase in yield of the semiconductor devices.

According to the fifth aspect of the present invention, invasion of water etc. from the section of the interconnection is prevented to prevent corrosion of the pad in the semiconductor integrated circuit, providing the effect of improving the reliability and durability of the semiconductor device products.

According to the sixth aspect of the present invention, the bend prevents penetration of water etc. from the interconnection to prevent corrosion of the pad in the chip, providing the effect of improving the reliability and durability of the semiconductor device products.

The seventh aspect of the present invention provides a semiconductor device which prevents invasion of water etc. from the interconnection to prevent corrosion of pads in the chip.

According to the eighth aspect of the present invention, an insulating film is simultaneously formed in the groove, on the semiconductor integrated circuit formation region except on the pad of the semiconductor integrated circuit, and on the cutting region, which provides the effect of moderating the accuracies in design and application of the mask for forming the insulating film.

The present invention has been made to solve such problems stated above, and it is an object to obtain a semiconductor wafer and a semiconductor device which prevent corrosion of pads in a semiconductor integrated circuit and a method of manufacturing the semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
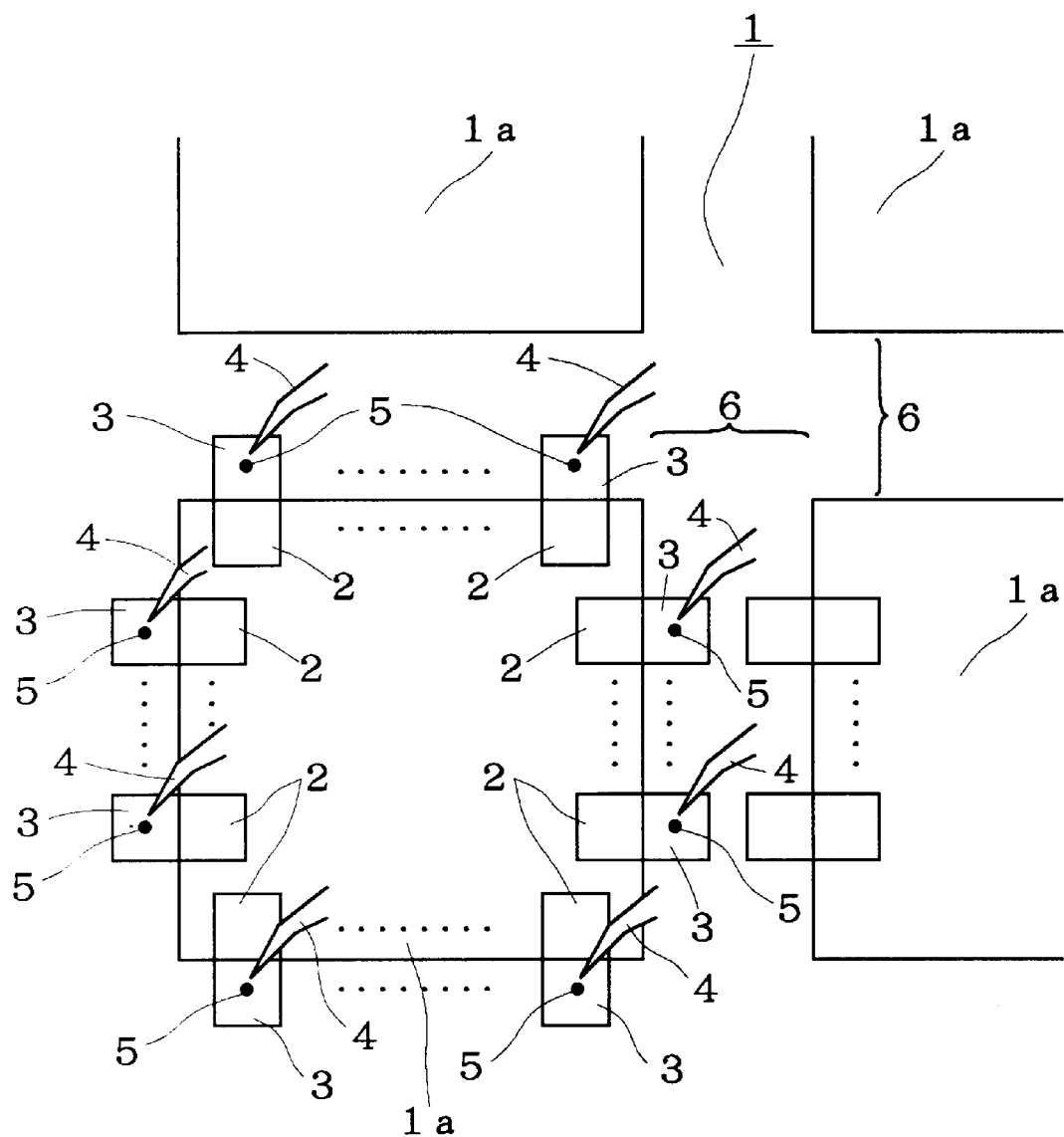
FIG. 1 is a top view showing a method of manufacturing a semiconductor device in a first preferred embodiment of the present invention.
Figure 2:
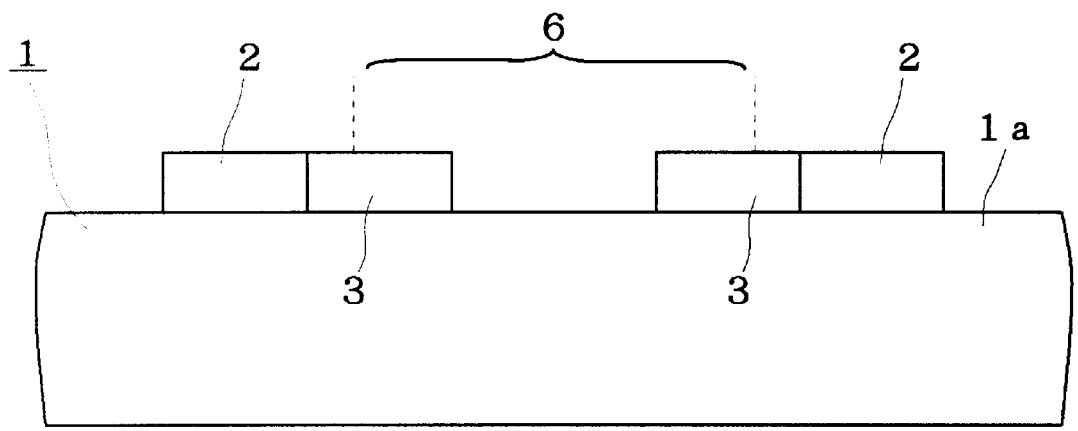
FIG. 2 is a sectional view showing the method of manufacturing the semiconductor device in the first preferred embodiment of the present invention.

FIG. 1 to FIG. 7 are diagrams showing a method of manufacturing a semiconductor device according to a first preferred embodiment of the present invention. First, referring to FIG. 1, a semiconductor wafer 1 is prepared. Semiconductor integrated circuits 1a are formed on the integrated circuit formation regions on the semiconductor wafer 1. The dicing line 6, which is a cutting region, partitions the semiconductor integrated circuit formation region. Wire-bonding pads 2 are formed on the semiconductor integrated circuits 1a. The wire-bonding pads 2 extend onto the dicing line 6, the wire-bonding pads 2 on the dicing line 6 serving as wafer testing pads 3, and the wire-bonding pads 2 and the wafer testing pads 3 are electrically connected. That is to say, the wire-bonding pads 2 on the dicing line 6 serve as the wafer testing pads 3 and the portions extending from the semiconductor integrated circuits 1a across the dicing line 6 in the wire-bonding pads 2 serve as interconnections electrically connecting the wire-bonding pads 2 and the wafer testing pads 3. FIG. 2 shows a section of FIG. 1.

A wafer test is applied to this semiconductor wafer 1. In the wafer test, wafer testing probes 4 are brought into contact with the wafer testing pads 3 for a conduction test. The wafer testing probes 4 are not brought into contact with the wire-bonding pads 2 on the semiconductor integrated circuit 1a. Accordingly, damages 5 is not caused to the wire-bonding pads 2 on the semiconductor integrated circuit 1a.

Figure 3:
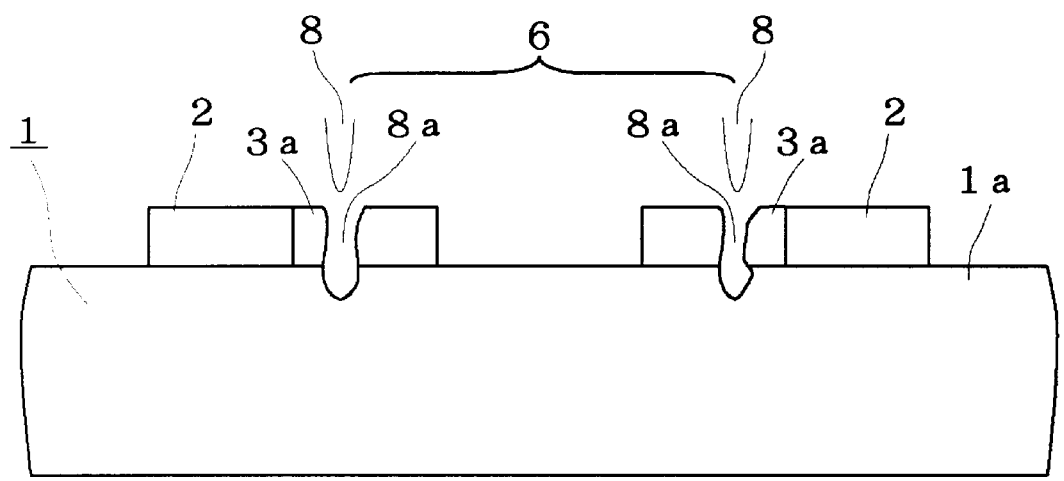
FIG. 3 is a sectional view showing the method of manufacturing the semiconductor device in the first preferred embodiment of the present invention.
Figure 4:
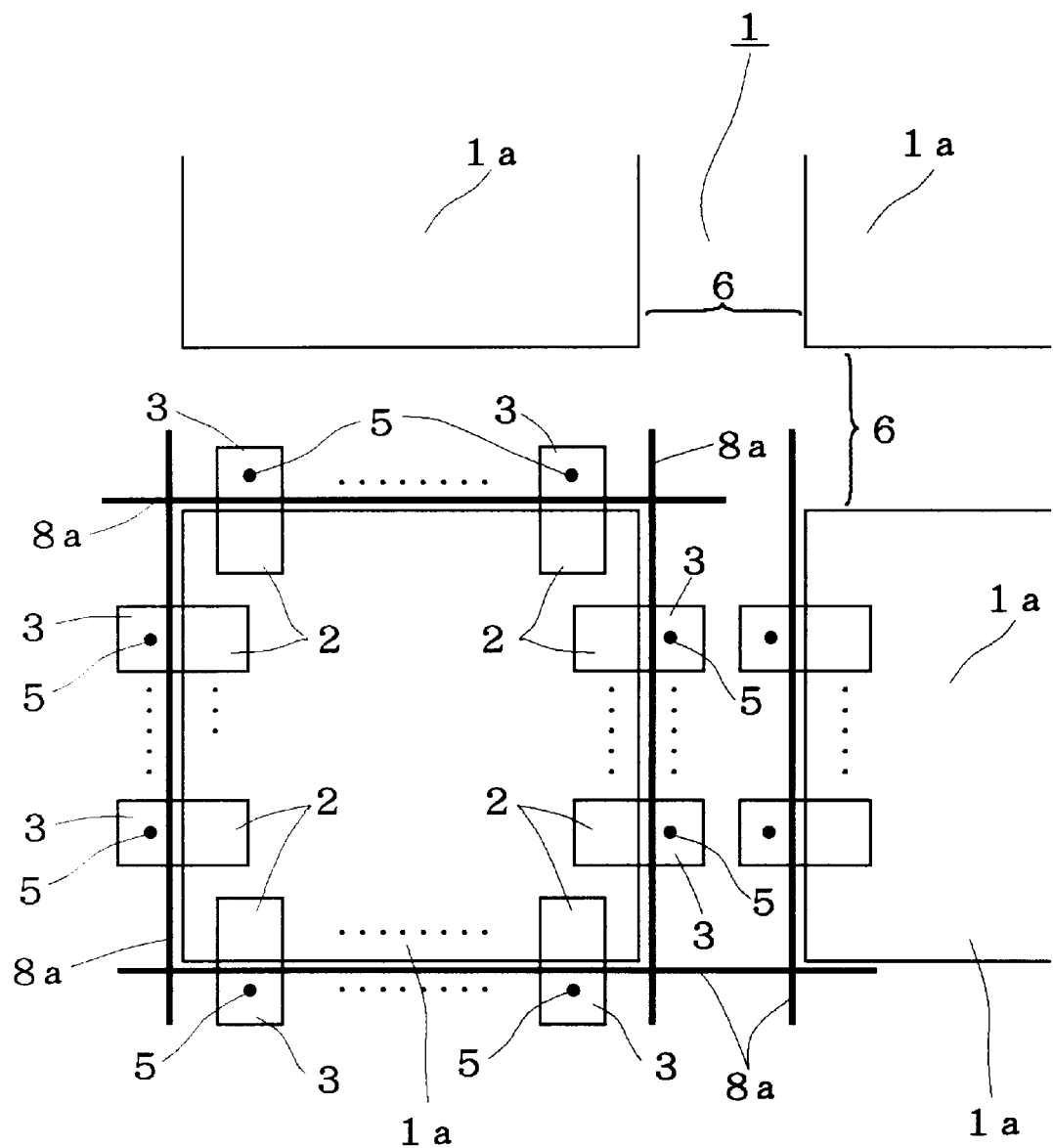
FIG. 4 is a top view showing the method of manufacturing the semiconductor device in the first preferred embodiment of the present invention.

Next, referring to FIG. 3, grooves 8a are formed in the boundaries between the semiconductor integrated circuit formation regions and the dicing line 6, or the cutting region, using a laser lightbeam 8. (Pre-cutting process) The groove 8a extends through from the surface of the wafer testing pads 3 and cuts off the wafer testing pads 3 serving as interconnection. This cut does not pass through from the surface of the semiconductor integrated circuit 1a to the back side (that is, it does not cut the substrate into chips.) Part of each of the wafer testing pads 3 is left on the semiconductor integrated circuit formation region as the wafer testing pad remainders 3a. FIG. 4 shows the upper surface of FIG. 3.

Figure 5:
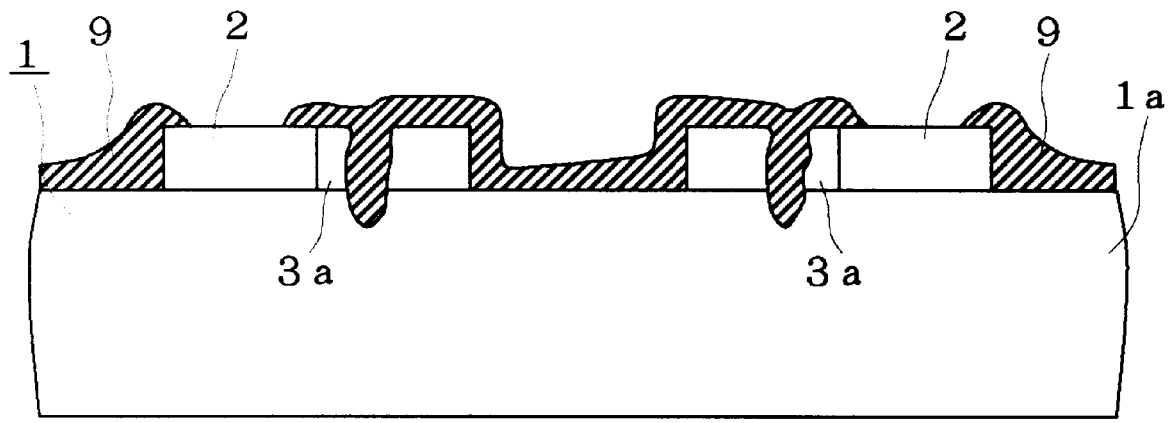
FIG. 5 is a sectional view showing the method of manufacturing the semiconductor device in the first preferred embodiment of the present invention.
Figure 6:
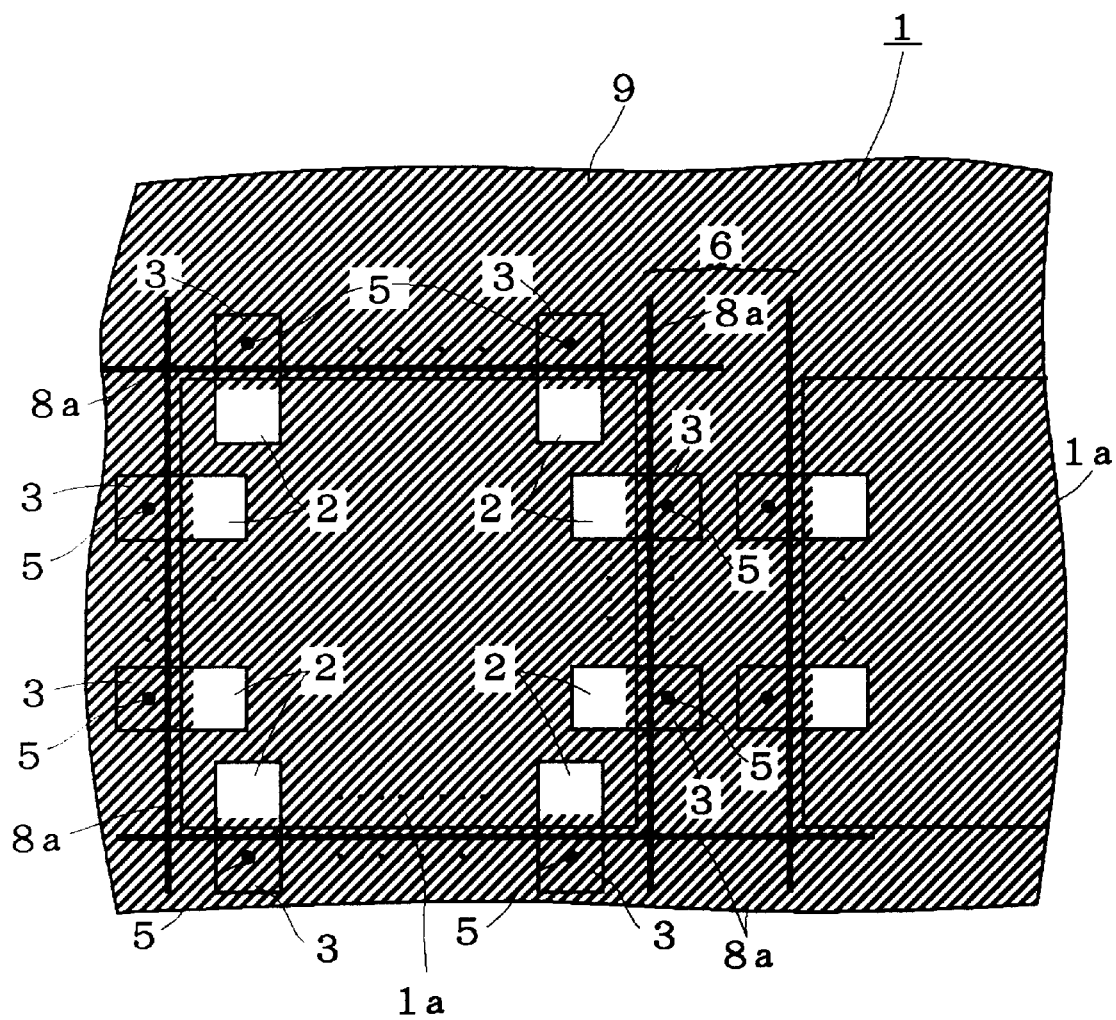
FIG. 6 is a top view showing the method of manufacturing the semiconductor device in the first preferred embodiment of the present invention.

Next, referring to FIG. 5, an insulating film 9 covering the cut sections of the wafer testing pads 3 is formed in the grooves 8a. (Insulating film formation process) The insulating film 9 is a passivation film, a polyimide film, or the like, which is formed on the semiconductor integrated circuit formation region, except on the wire-bonding pads 2, and on the cutting region. FIG. 6 shows the upper surface of FIG. 5.

Figure 7:
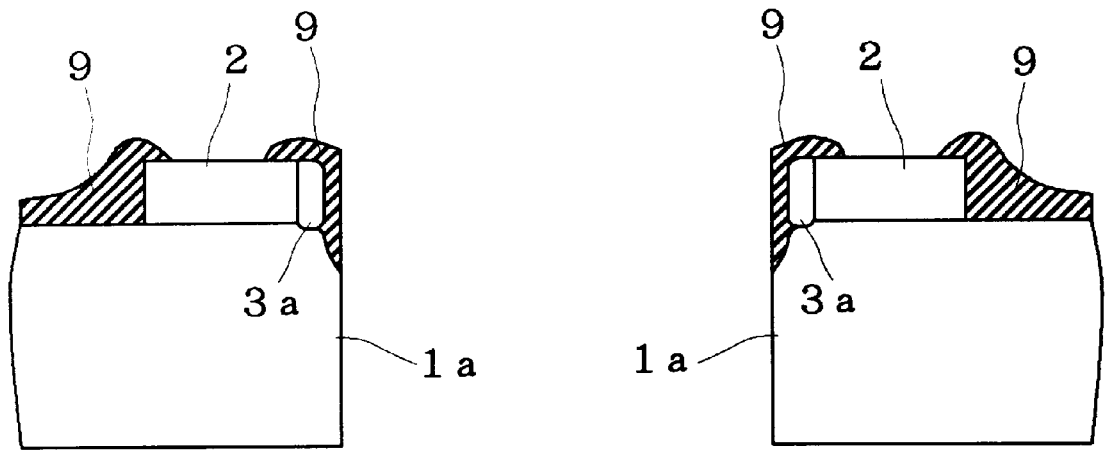
FIG. 7 is a sectional view showing the semiconductor devices in the first preferred embodiment of the present invention.

Next, referring to FIG. 7, the large number of semiconductor integrated circuits 1a are cut into chips along the dicing line 6. (Final cutting process) The semiconductor integrated circuit 1a has the insulating film 9 covering the sections of the wafer testing pads 3.

In this preferred embodiment, the insulating film 9 completely covers the wafer testing pad remainders 3a, which are remainders of the wire-bonding pads 2 left in the chip after the chip is separated, to prevent invasion of moisture etc., which prevents corrosion of the wire-bonding pads 2 in the chip. This enhances reliability and durability of the semiconductor device products.

Figure 23:
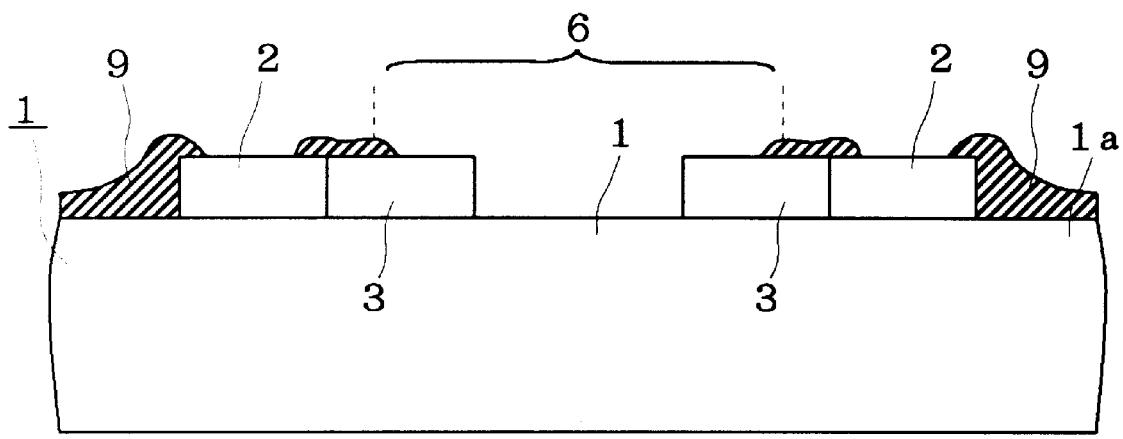
FIG. 23 is a sectional view of the conventional semiconductor wafer.
Figure 24:
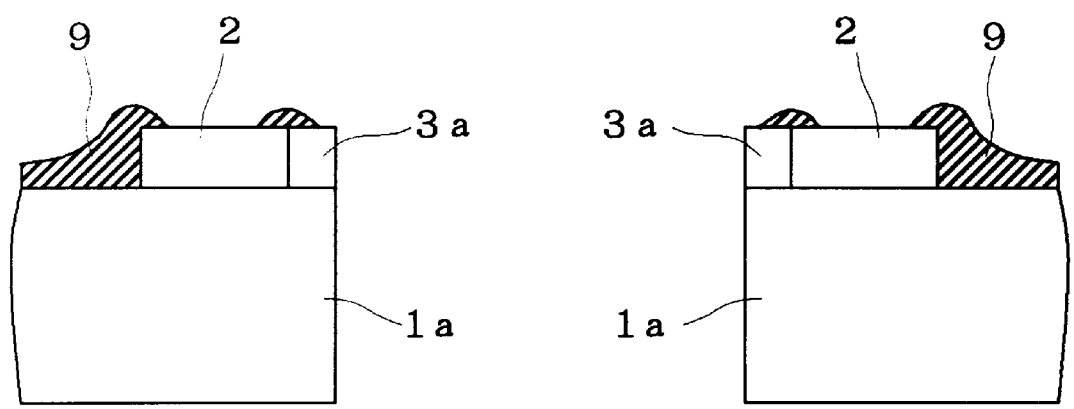
FIG. 24 is a sectional view of the conventional semiconductor devices.

The pre-cutting process, the insulating film formation process and the final cutting process may be performed after preparing the semiconductor wafer 1 shown in FIG. 23. In this case, however, while the insulating film 9 for protecting the active regions on the semiconductor integrated circuits 1a is formed in the semiconductor wafer 1 shown in FIG. 23, the insulating film 9 is further applied in the insulating film formation process. Accordingly, as compared with the conventional devices, higher accuracies are required in mask design, mask application, etc. to ensure the wafer testing pads 3, providing a factor for decreasing the production yield.

Also, in the insulating film formation process shown in FIG. 5, the semiconductor integrated circuits 1a, except for the surfaces of the wire-bonding pads 2 and the dicing line 6, are covered with the insulating film 9. On the other hand, in FIG. 23, the semiconductor integrated circuits 1a, except the surfaces of the wire-bonding pads 2 and a part of the dicing line 6, are covered and the wafer testing pads 3 are exposed for wafer test. Hence, less accuracy is required in FIG. 5 in mask design and application for applying the insulating film 9 as compared with FIG. 23, because the wafer testing pads 3 are not exposed.

Second Preferred Embodiment

Figure 8:
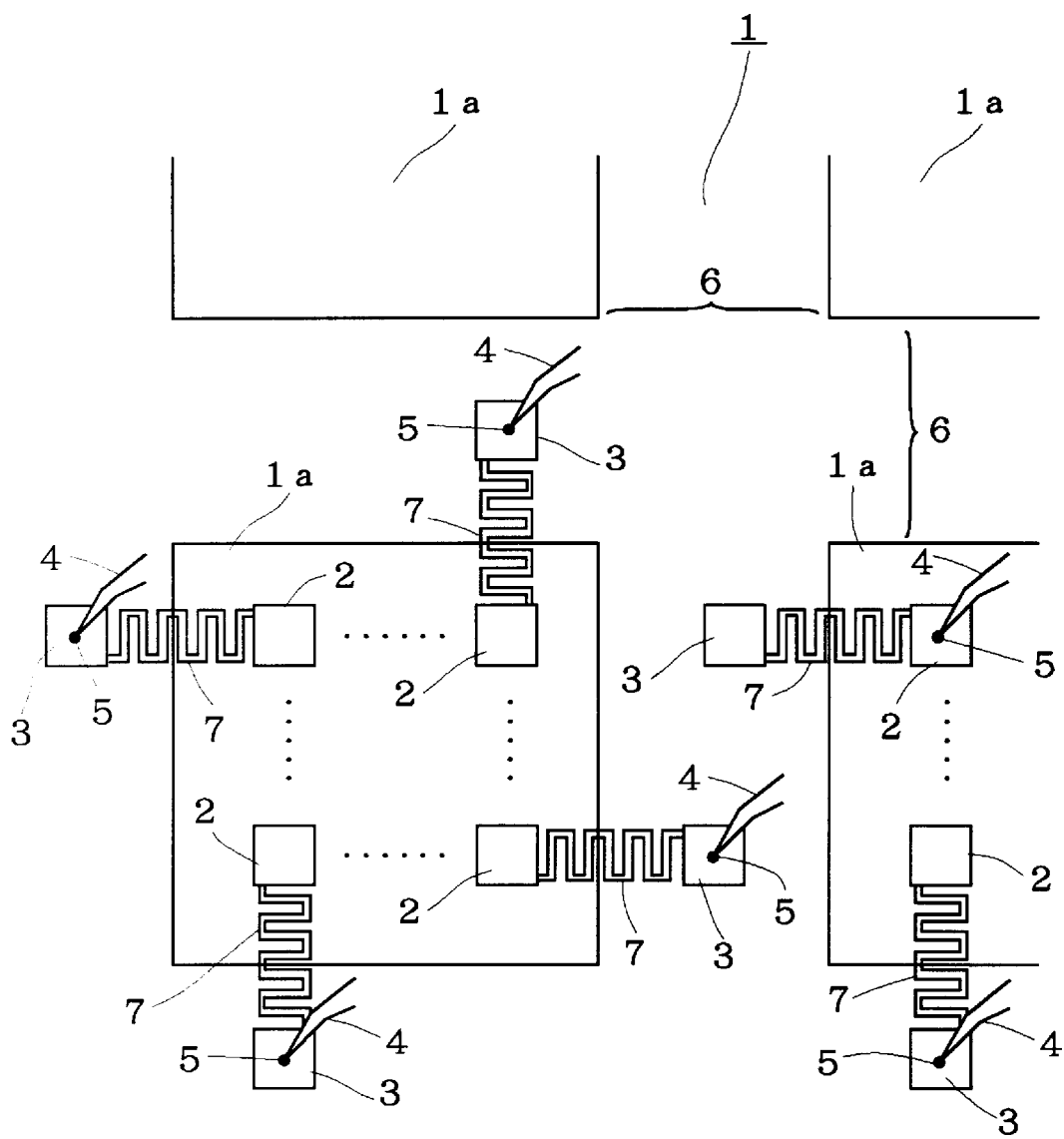
FIG. 8 is a top view showing a semiconductor wafer in a second preferred embodiment of the present invention.

FIG. 8 is a diagram showing a semiconductor wafer in a second preferred embodiment of the present invention. In FIG. 8, 1 denotes a semiconductor wafer, 1a denotes a semiconductor integrated circuit formed on the semiconductor integrated circuit formation region on the semiconductor wafer 1, 2 denotes a wire-bonding pad formed in the semiconductor integrated circuit 1a, 3 denotes a wafer testing pad, 4 denotes a wafer testing probe used in the wafer test, 5 denotes damage on the wafer testing pad 3, 6 denotes a dicing line which is a cutting region for partitioning the semiconductor integrated circuit formation region, and 7 denotes a extension aluminum interconnection connecting the wire-bonding pad 2 and the wafer testing pad 3.

The semiconductor integrated circuit 1a is formed on the semiconductor integrated circuit formation region in the surface of the semiconductor wafer 1. The dicing line 6 partitions the semiconductor integrated circuit formation region. A large number of wire-bonding pads 2 are formed on the semiconductor integrated circuit 1a. The wafer testing pads 3 are formed on the dicing line 6. The extension aluminum interconnections 7 electrically connect the wire-bonding pads 2 and the wafer testing pads 3. The extension aluminum interconnection 7 is shaped to have bends like a straight line bent at sharp angles as shown in FIG. 8, and the bends are formed at least on the semiconductor integrated circuit formation region. An insulating film (not shown) formed of a passivation film, polyimide film, etc. is formed on the semiconductor integrated circuit formation region except on the wire-bonding pads 2, and on the cutting region.

A wafer test is applied to this semiconductor wafer 1. In the wafer test, a conduction test is carried out with the wafer testing probes 4 in contact with the wafer testing pads 3. The wafer testing probes 4 are not brought into contact with the wire-bonding pads 2. Accordingly, the damage 5 is not caused on the wire-bonding pads 2. After the wafer test, the insulating film 9 is applied on the surface of the semiconductor wafer 1 such that the wire-bonding pads 2 are exposed. Or, the insulating film 9 may be applied on the surface of the semiconductor wafer 1 in such a way that the wire-bonding pads 2 and the wafer testing pads 3 are exposed before the wafer test. Subsequently, the semiconductor wafer 1 is cut along the dicing line 6 so that the large number of semiconductor integrated circuits 1a are separated into chips. Hence, water etc. will penetrate only from the sections of the extension aluminum interconnections 7. However, the bends suppress its penetration into the extension aluminum interconnections 7 and its approach to the wire-bonding pads 2.

According to this preferred embodiment, the bends prevent invasion of water etc. to prevent corrosion of the wire-bonding pads 2 in the chip, which enhances the reliability and durability of the semiconductor device products.

The pre-cutting process, the insulating film formation process and the final cutting process described in the first preferred embodiment may be used. In this case, the sections of the extension aluminum interconnections 7 are covered with the insulating film 9, providing further improvements in reliability and durability of the semiconductor device products.

The bends of the extension aluminum interconnection 7 may be U-shaped, L-shaped, zig-zag-shaped, or combinations thereof.

Third Preferred Embodiment

Figure 9:
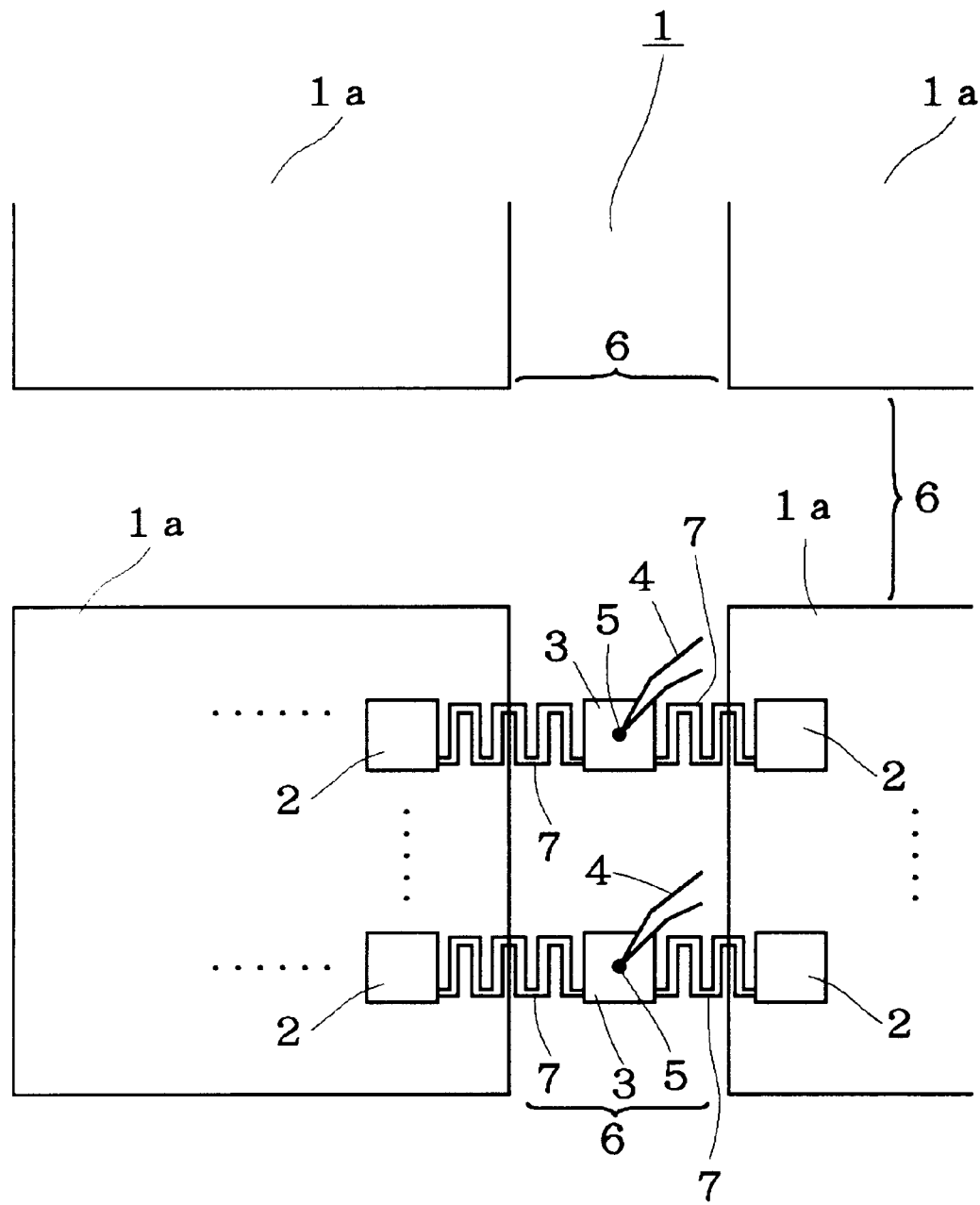
FIG. 9 is a top view showing a semiconductor wafer in a third preferred embodiment of the present invention.

FIG. 9 is a diagram showing a semiconductor wafer in a third preferred embodiment of the present invention. The reference characters in FIG. 9 correspond to the reference characters in FIG. 8. As shown in FIG. 9, the wire-bonding pads 2 on a plurality of adjacent semiconductor integrated circuits 1a and one wafer testing pad 3 are electrically connected through the extension aluminum interconnection 7 having bends. The bends of the extension aluminum interconnection 7 are formed at least on the semiconductor integrated circuit formation region.

In this preferred embodiment, in addition to the third preferred embodiment, a plurality of wire-bonding pads 2 and a single wafer testing pad 3 are electrically connected through the extension aluminum interconnection 7, which permits miniaturization of the dicing line 6, leading to an increase in yield of the semiconductor devices.

Fourth Preferred Embodiment

Figure 10:
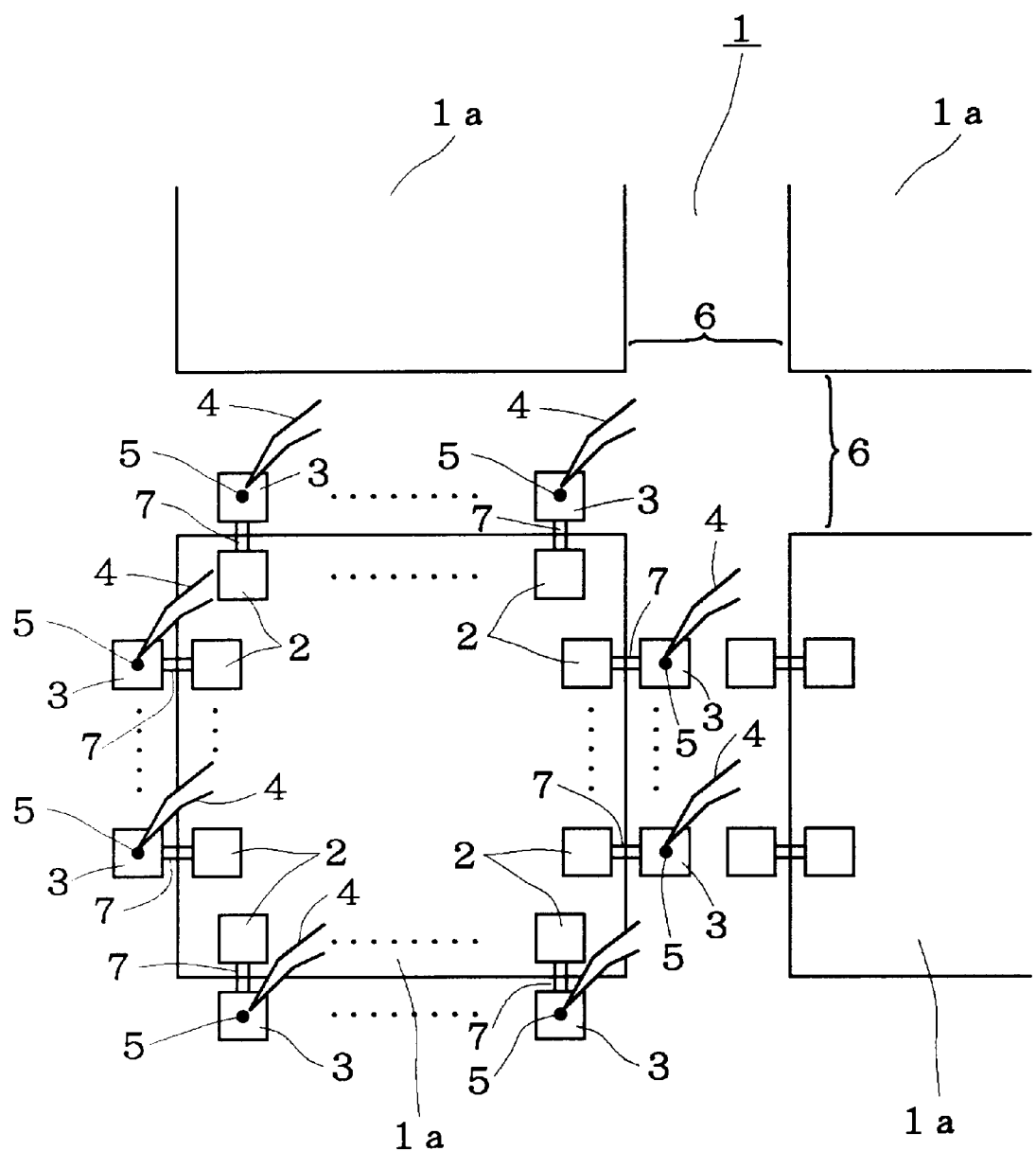
FIG. 10 is a top view showing a semiconductor wafer in a fourth preferred embodiment of the present invention.

FIG. 10 to FIG. 15 are diagrams showing modifications of the semiconductor wafer of the first preferred embodiment. First, FIG. 10 is a modification of FIG. 1, where the connection for electrically connecting the wire-bonding pad 2 and the wafer testing pad 3 is replaced by the extension aluminum interconnection 7.

Figure 11:
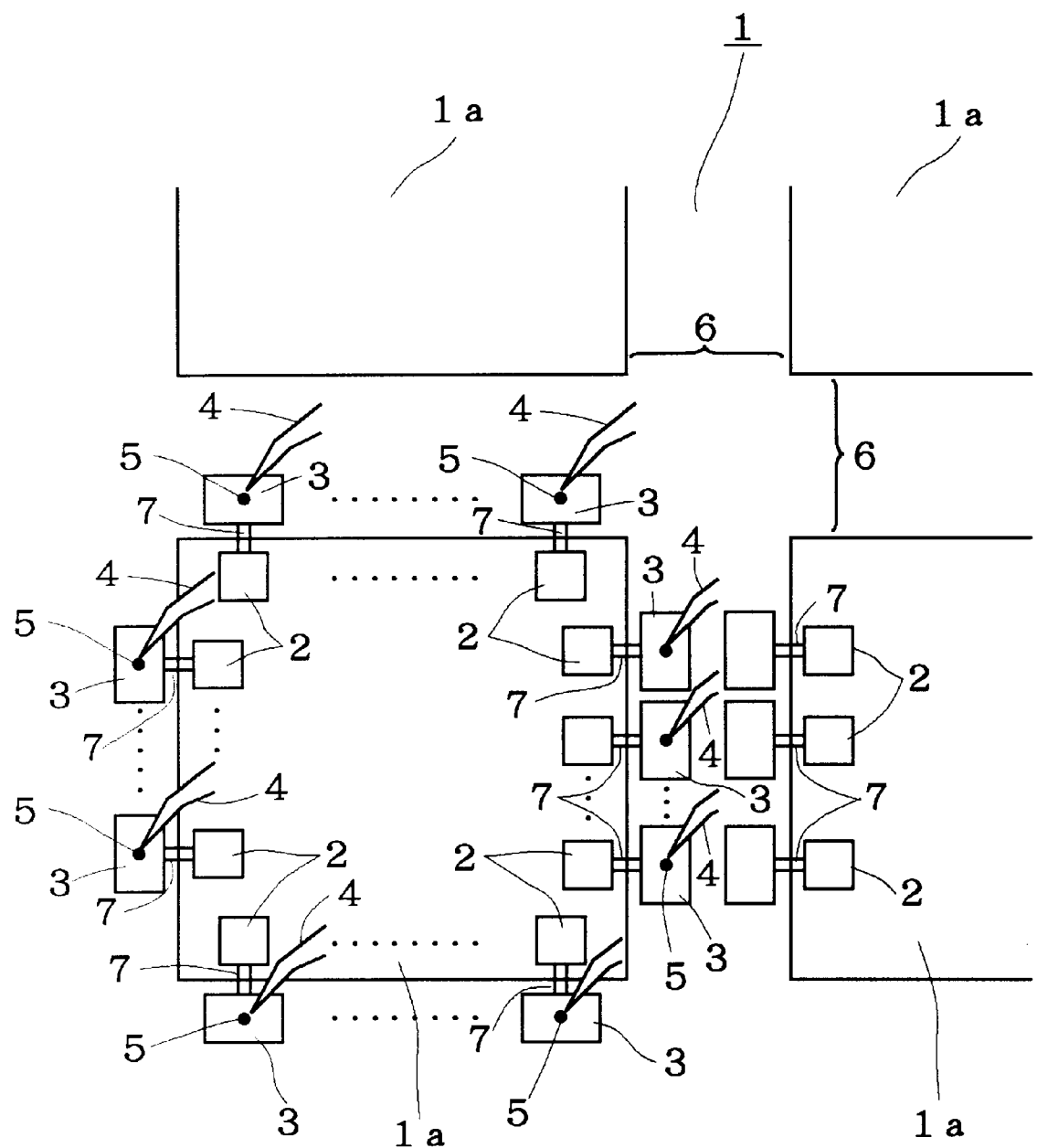
FIG. 11 is a top view showing a semiconductor wafer in the fourth preferred embodiment of the present invention.

Next, FIG. 11 is a modification of FIG. 10, where the surface area of the wafer testing pad 3 is larger than the surface area of the wire-bonding pad 2. It is preferred that the wafer testing pad 3 be formed large using as much of the surface of the dicing line 6 as possible. Increasing the surface area of the wafer testing pad 3 increases the permissible positional deviation of contact between the wafer testing probe 4 and the wafer testing pad 3, which facilitates the wafer test.

Figure 12:
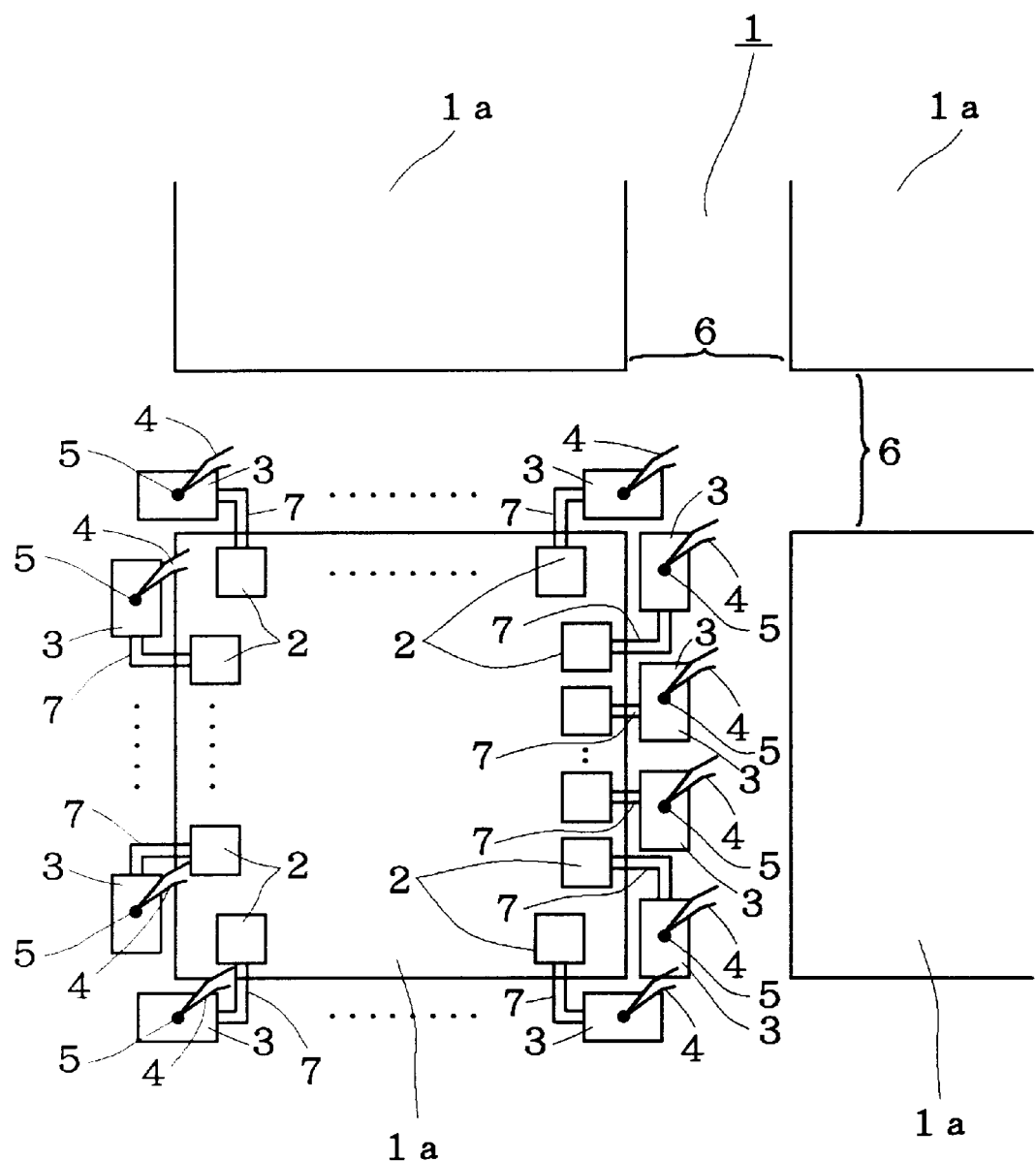
FIG. 12 is a top view showing a semiconductor wafer in the fourth preferred embodiment of the present invention.

Next, FIG. 12 is a modification of FIG. 11, where the wafer testing pads 3 are disposed also on the dicing line 6 near the corners of the semiconductor integrated circuit 1a. While vacant areas (blanks) having the same area as the area in which at least one wafer testing pad 3 can be formed exist on the dicing line 6 near the corners of the semiconductor integrated circuit 1a in FIG. 11, the wafer testing pads 3 in FIG. 12 are formed also on the dicing line 6 near the corners of the semiconductor integrated circuit 1a so that such vacant areas do not exist on the dicing line 6 in order to efficiently utilize the dicing line 6. The extension aluminum interconnection 7 is L-shaped, for example, to form the wafer testing pad 3 also near the corner of the dicing line 6.

Figure 13:
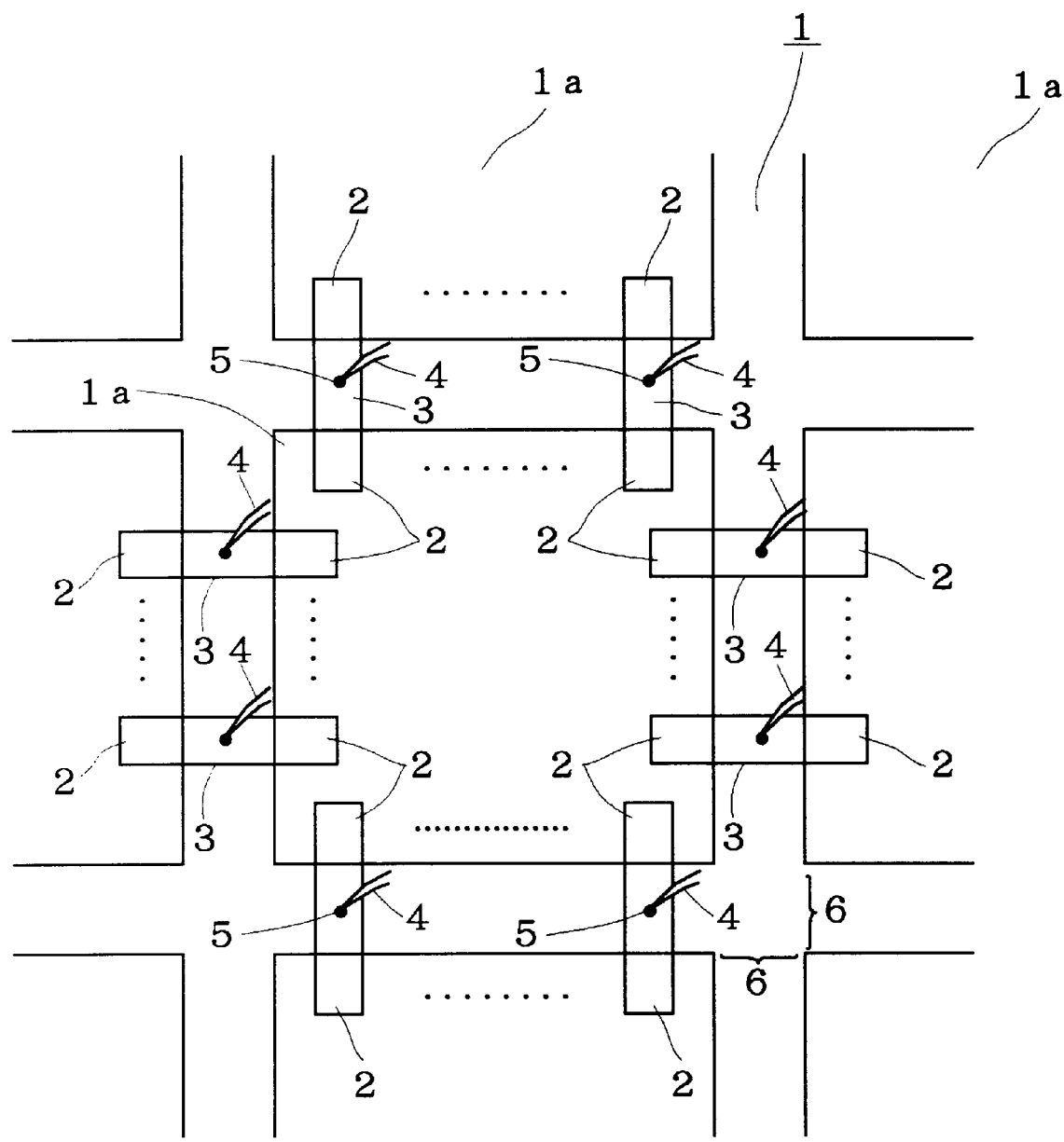
FIG. 13 is a top view showing a semiconductor wafer in the fourth preferred embodiment of the present invention.

Next, FIG. 13 is a modification of FIG. 1, wherein wire-bonding pads 2 on the adjacent plurality of semiconductor integrated circuits 1a are formed of one wire-bonding pad 2, with the center of the wire-bonding pad 2 serving as a wafer testing pad 3, which allows miniaturization of the dicing line 6, leading to an increase in yield of the semiconductor devices.

Figure 14:
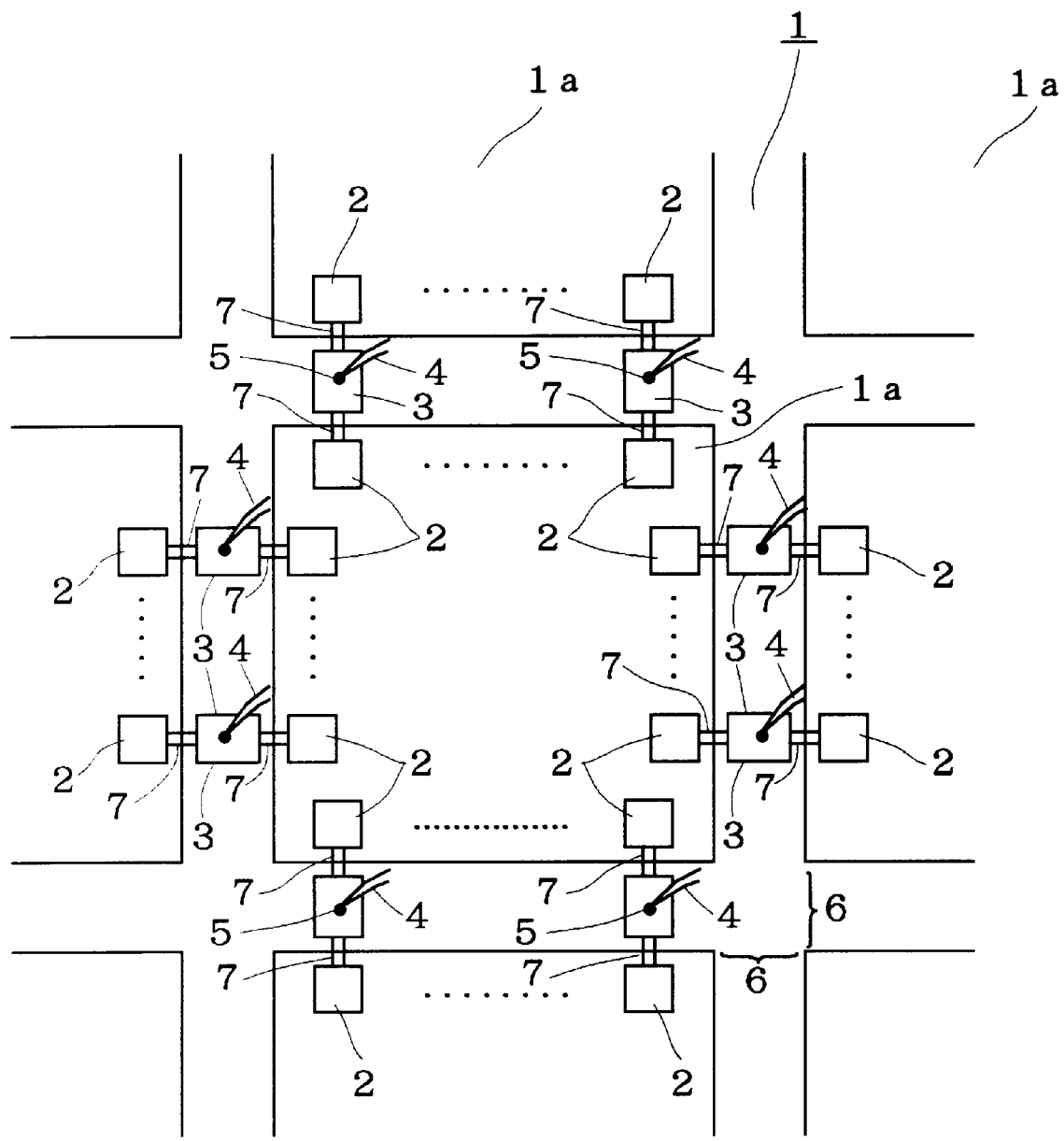
FIG. 14 is a top view showing a semiconductor wafer in the fourth preferred embodiment of the present invention.

Next, FIG. 14 is a modification of FIG. 13, where the connection extending across from the semiconductor integrated circuit 1a to the dicing line 6 for electrically connecting the wire-bonding pad 2 and the wafer testing pad 3 is replaced by the extension aluminum interconnection 7.

Figure 15:
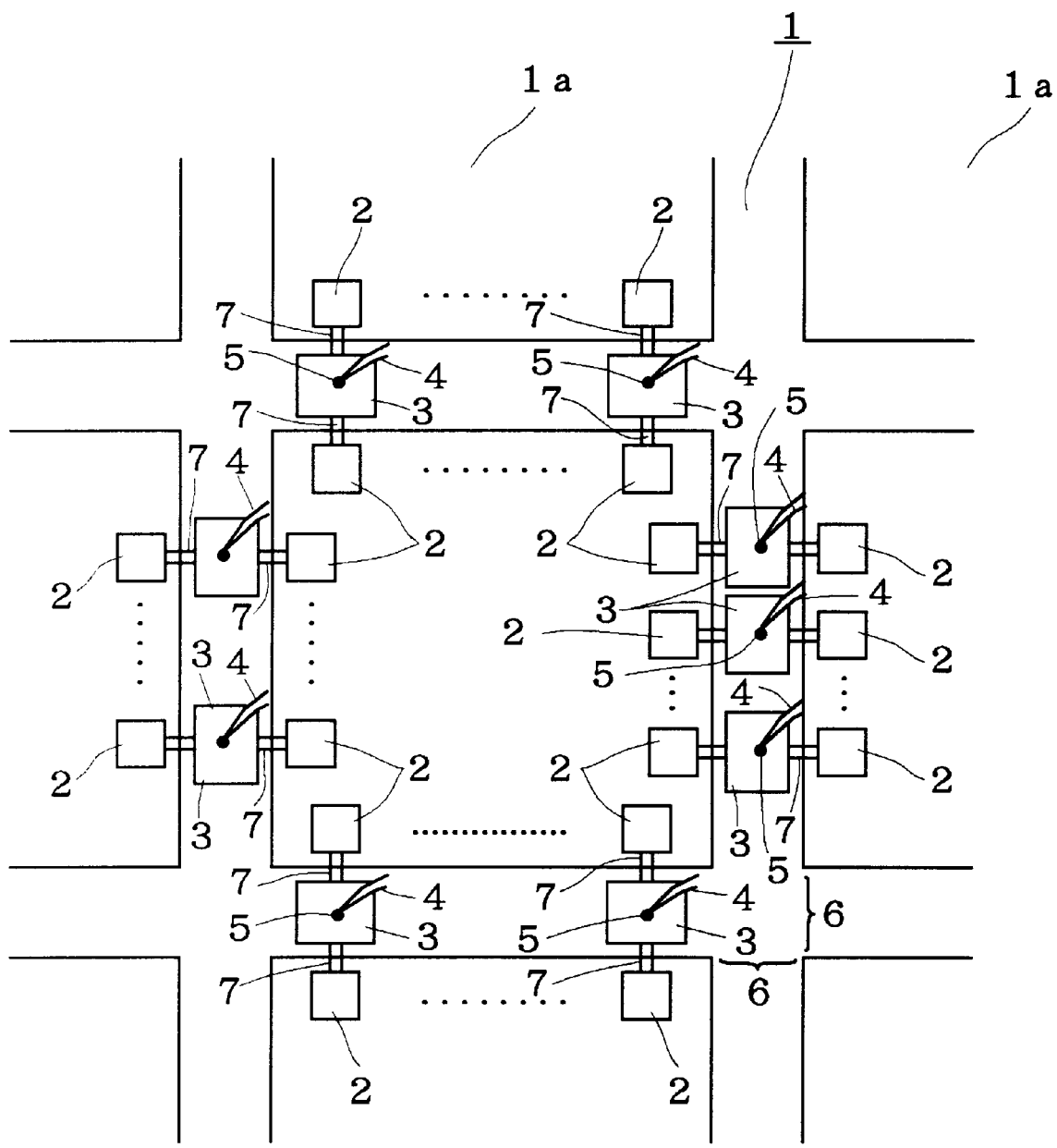
FIG. 15 is a top view showing a semiconductor wafer in the fourth preferred embodiment of the present invention.
Figure 16:
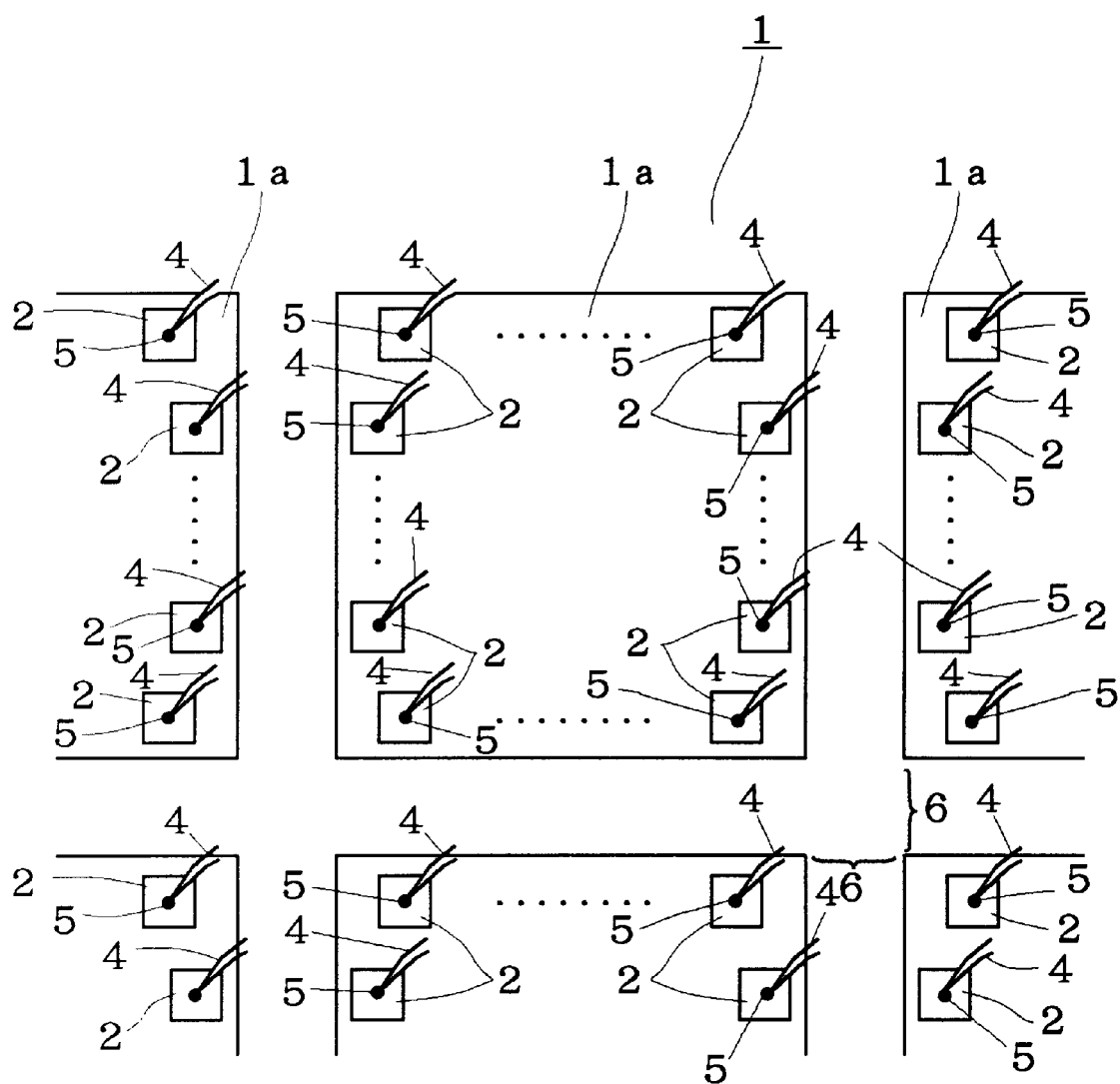
FIG. 16 is a top view showing a conventional semiconductor wafer.
Figure 17:
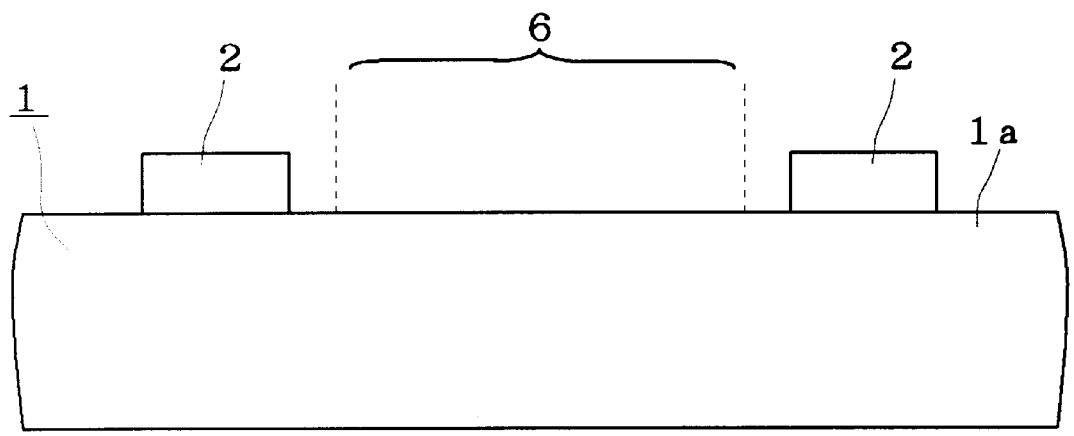
FIG. 17 is a sectional view of FIG. 16.
Figure 18:
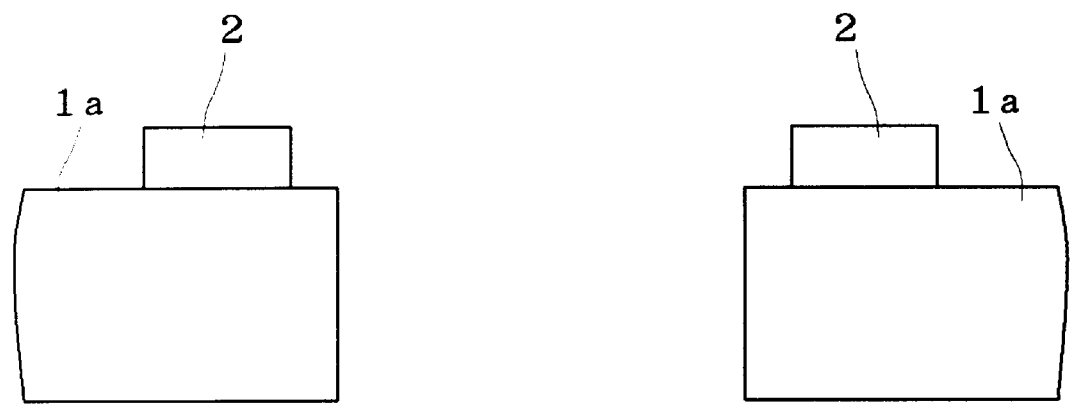
FIG. 18 is a sectional view showing the conventional semiconductor devices.
Figure 19:
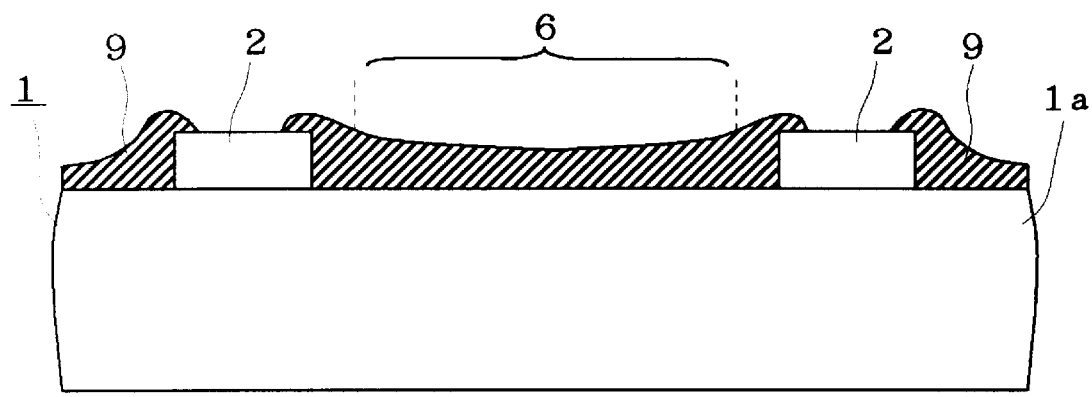
FIG. 19 is a sectional view of conventional semiconductor wafer.
Figure 20:
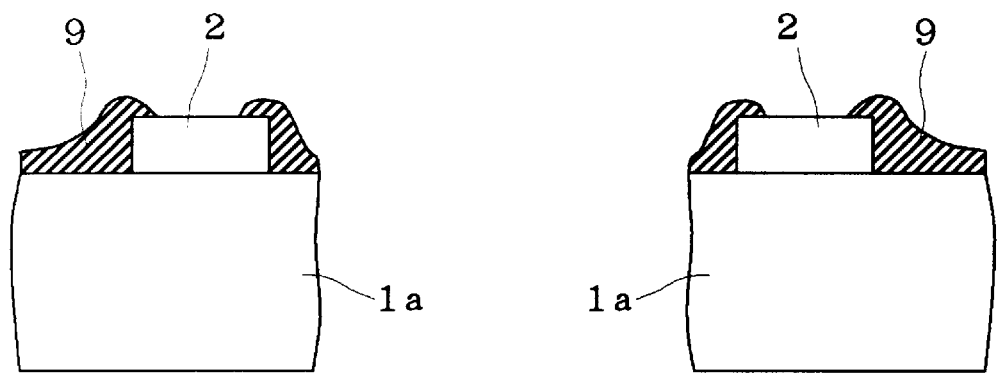
FIG. 20 is a sectional view of the conventional semiconductor devices.
Figure 21:
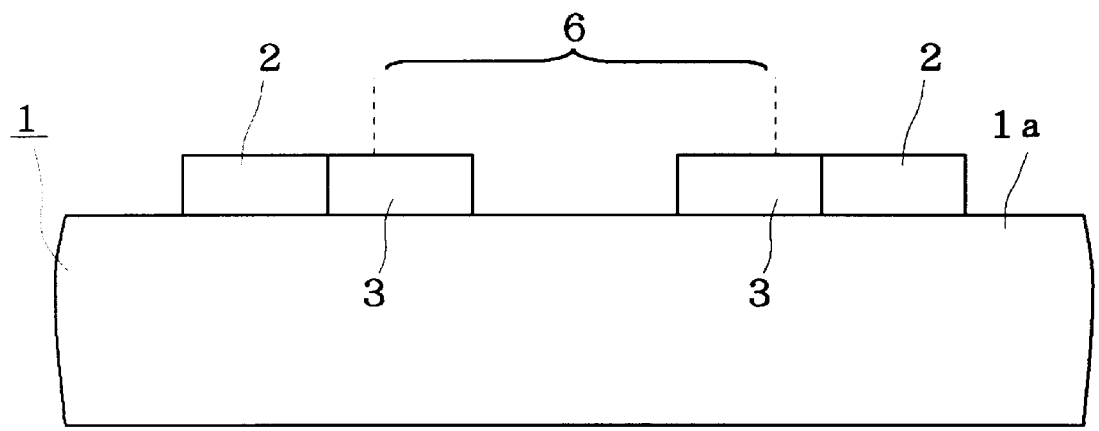
FIG. 21 is a sectional view of a conventional semiconductor wafer.
Figure 22:
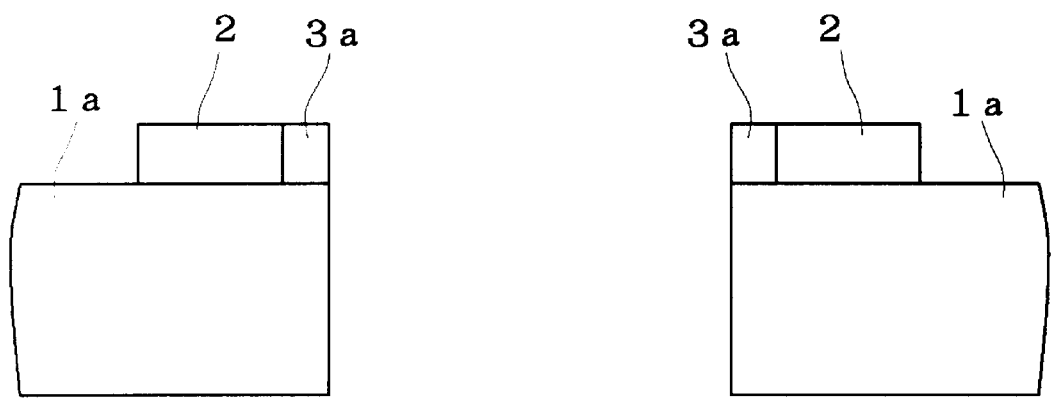
FIG. 22 is a sectional view of the conventional semiconductor devices.

Next, FIG. 15 shows a modification of FIG. 14, where the surface area of the wafer testing pad 3 is larger than the surface area of the wire-bonding pad 2.

In the semiconductor wafers 1 shown in FIG. 10 to FIG. 15, the semiconductor integrated circuits 1a separated into chips are formed by using the pre-cutting process, the insulating film formation process and the final cutting process explained for the first preferred embodiment. The separated semiconductor integrated circuits 1a have the insulating films 9 covering the cut sections of the wafer testing pads 3.

As the semiconductor wafers 1 shown in FIGS. 10, 11, 12, 14 and 15, semiconductor wafers 1 may be used in which the extension aluminum interconnections 7 are replaced by the extension aluminum interconnections having bends, the bends being formed at least on the semiconductor integrated circuit formation regions.

While the invention has been described in detail, the foregoing description is in all aspects illustrative and not restrictive. It is understood that numerous other modifications and variations can be devised without departing from the scope of the invention.

I claim:

1. A semiconductor wafer including an integrated circuit comprising:

a semiconductor wafer;
   at least one semiconductor integrated circuit formation region on said semiconductor wafer and including a semiconductor integrated circuit having a first pad;
   a cutting region on said semiconductor wafer surrounding said at least one semiconductor integrated circuit formation region for cutting said semiconductor wafer to form a chip including said semiconductor integrated circuit;
   a second pad disposed on said semiconductor wafer in the cutting region; and
   at least one aluminum interconnection on said semiconductor wafer electrically connecting said first pad to said second pad and having a meandering shape to prevent corrosion of said first pad, and including a plurality of U-shaped bends in said semiconductor integrated circuit formation region, each of the U-shaped bends connecting two generally parallel parts of said aluminum interconnection.

2. The semiconductor wafer according to claim 1, wherein said second pad is larger than said first pad.

3. The semiconductor wafer according to claim 1, including a plurality of said second pads surrounding said at least one semiconductor integrated circuit formation region so that areas between adjacent second pads are smaller than a second pad and no additional second pad can be located in said cutting region adjacent said at least one semiconductor integrated circuit formation region.

4. The semiconductor wafer according to claim 1, wherein said at least one semiconductor integrated circuit formation region comprises first and second semiconductor integrated circuit formation regions, and said at least one aluminum interconnection includes first and second aluminum interconnections.

5. A semiconductor device comprising a semiconductor wafer, a semiconductor chip integrated circuit formation region on said semiconductor wafer and including a semiconductor integrated circuit, a cutting region on said semiconductor wafer surrounding said semiconductor formation region, an interconnection extending from said semiconductor integrated circuit formation region toward said cutting region, a groove in said cutting region surrounding said integrated circuit formation region and passing through said interconnection and into but not through said semiconductor wafer, and an insulating film filling the groove in and covering said interconnection in the groove.

6. A semiconductor device comprising a semiconductor wafer, a semiconductor integrated circuit formation region on said semiconductor wafer and including a semiconductor integrated circuit, a cutting region on said semi-conductor wafer surrounding said semiconductor integrated circuit formation region, and an aluminum interconnection extending from and electrically connecting said semiconductor integrated circuit formation region to said cutting region, wherein said aluminum interconnection has a meandering shape to prevent corrosion of said aluminum interconnection, said aluminum interconnection including a plurality of U-shaped bends, each of the U-shaped bends connecting two generally parallel parts of said aluminum interconnection.

7. The semiconductor wafer according to claim 6, wherein said aluminum interconnection has a meandering shape in said semiconductor integrated circuit formation region.

8. The semiconductor wafer according to claim 6, wherein said aluminum interconnection has a meandering shape in said cutting region.

* * * * *